United States Patent [19]

Matsuo et al.

[11] Patent Number: 4,842,672

[45] Date of Patent: Jun. 27, 1989

[54] APPARATUS FOR CONVEYING BASE

[75] Inventors: Takao Matsuo, Hyogo; Shigeo Sumi, Saitama, both of Japan

[73] Assignee: Somar Corporation, Tokyo, Japan

[21] Appl. No.: 921,511

[22] Filed: Oct. 22, 1986

[30] Foreign Application Priority Data

Oct. 22, 1985 [JP] Japan ................................ 60-236862

[51] Int. Cl.[4] ...................... B32B 31/10; B32B 31/18; B32B 31/20
[52] U.S. Cl. .................................. 156/497; 156/555; 156/559; 156/581; 271/227; 271/254
[58] Field of Search ............... 156/351, 364, 555, 559, 156/566, 581, 583.1, 497; 271/261, 272, 227, 240, 253, 254, 255

[56] References Cited

U.S. PATENT DOCUMENTS

| 4,025,380 | 5/1977 | Bernardo | 156/555 |
| 4,214,936 | 7/1980 | Del Bianco | 156/555 |
| 4,585,509 | 4/1986 | Obayashi | 136/555 |
| 4,659,419 | 4/1987 | Miyake | 156/555 |

Primary Examiner—George F. Lesmes
Assistant Examiner—J. Davis
Attorney, Agent, or Firm—Sughrue, Mion, Zinn, Macpeak & Seas

[57] ABSTRACT

An apparatus for conveying a base, having feed rollers and presser rollers, is disclosed which comprises a sheet press-clamping mechanism for clamping a sheet to be arranged on the base; and a base holding member for temporarily holding the base in position when the base has been fed to a predetermined position of the sheet press-clamping mechanism. The base holding member is projected to press the base when the base has been fed to the sheet press-clamping mechanism. The base holding member is retracted when the base is set at the sheet press-clamping mechanism.

4 Claims, 5 Drawing Sheets

APPARATUS FOR CONVEYING BASE

BACKGROUND OF THE INVENTION

This invention relates to an apparatus for conveying a base and more particularly to a technique effectively applicable to an apparatus for conveying a base for use in a film laminator.

Printed circuit boards for use in electronic equipment e.g., computers are such that a copper wiring or the like having a predetermined pattern is formed on the surface of an insulating base.

A printed circuit board of that sort is made in the following process steps. A laminate consisting of a photosensitive resin layer (photoresist) and a translucent resin film (protective film) for protecting the photosensitive resin layer is bonded onto a conductive layer provided on an insulating base through thermocompresson bonding. The thermocompression bonding of laminates is conducted by a laminator on a mass-production basis. Then a wiring pattern film is superposed on the laminate, and the photosensitive resin layer is exposed to light for a predetermined period of time through the wiring pattern film and the translucent resin film. The photosensitive resin layer thus exposed to light is developed to form an etching mask pattern after the translucent resin film is peeled off by a peeling device. Unnecessary portions of the conductive layer are subsequently removed by etching and the remaining photosensitive resin layer is also removed to form a printed circuit board having a predetermined wiring pattern.

During the process of manufacturing the printed circuit board, there is needless to say required the step of forming a laminate consisting of a photosensitive resin layer and a translucent resin film on an insulating base having conductive layers formed on both sides thereof through thermocompression bonding.

A roll of laminate continuously wound on a supply roller of a film laminator is pulled out and then cut into pieces corresponding in dimensions to the base to provide a laminate to be bonded thereto.

An apparatus for conveying the base to the thermocompresson roller position is equipped with a plurality of rotary means formed with a plurality of discoidal rollers (pinch rollers), which are rotated to move the base. When the base approaches the thermocompression rollers, fixed guide members guide the base crosswise toward the centerline in the conveyance direction and cause the thermocompression rollers to hold the base therebetween.

However, even if the base is set exactly along the centerline of the conveyance path, there is still a fear that the set position of the base would be offset from a desired position. Namely, when the base is set between the thermocompression-clamping members, a part of the base is only clamped thereby, so that there is a still fear that the base would be moved (forwardly or rearwardly, leftwardly or rightwardly, or upwardly or downwardly) by the collision shock of the clamping upon the initial clamping, or a leading end of the base would be likely to bent downwardly so that the position of the base would be offset from the set position of the thin film to be laminated.

The above-described and other problems to be solved by the present invention and novel features thereof will become manifest upon making reference to the detailed description which follows and the accompanying drawings.

SUMMARY OF THE INVENTION

A typical embodiment of the present invention disclosed hereby will briefly be outlined as follows :

According to the present invention, there is provided an apparatus for conveying a base, having feed rollers and presser rollers, which comprises a sheet press-clamping means for clamping a sheet to be arranged on the base; and a base holding means for temporarily holding the base in position when the base has been fed to a predetermined position of the press-clamping means.

In the apparatus for conveying a base to a position of the press-clamping means (for example, a tentatively clamping member, thermocompression rollers), there are provided a plurality of roller members each having a plurality of discs (pinch rollers). The rotation of the roller members causes the base to be moved. When the base is close to the press-clamping means, the base is shifted in the transverse direction in conformity with a centerline of the travelling path direction by means of stationary guide members. Then, the base is clamped by the press-clamping means. Under this state, the base holding member functions to tentatively hold the base at the position.

According to the present invention, the base is conveyed by the feed rollers while being pressed by the presser rollers. When the base has been fed to a position where the base is to be set at the press-clamping means, the base holding member is projected to press the base in a stationary position. When an initial shock caused by the press-clamping means is applied to the base, the base holding member is retracted therefrom. Thus, when the base is set at the press-clamping means, any offset between the thin plate to be supplied and the base plate may be prevented.

Referring now to the drawings, a description will be given of an embodiment of the present invention applied to an apparatus for conveying a base for a film laminator for bonding a laminate consisting of a photosensitive resin layer and a translucent resin film onto a printed circuit board through thermocompression bonding.

DETAILED DESCRIPTION OF THE PREFERRED EMBODIMENTS

Figure 1:
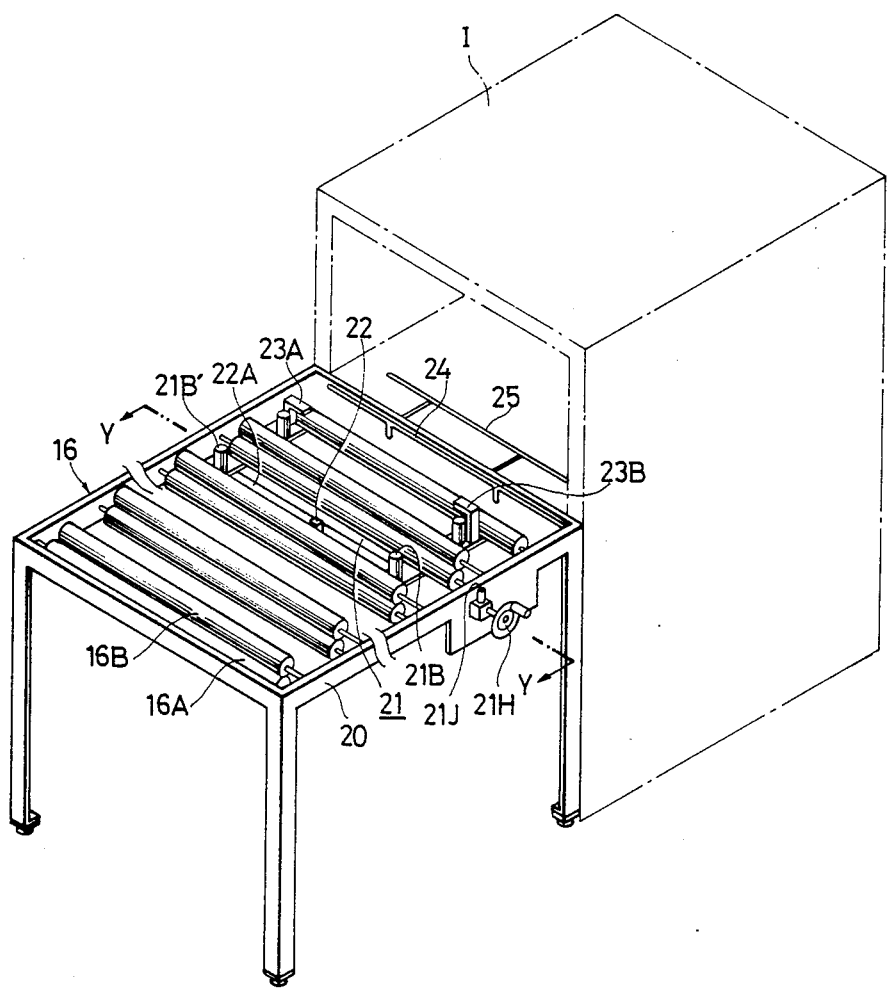
FIG. 1 is a perspective structural view of an apparatus for conveying a base according to the present intention.

In all drawings of the embodiment of the present invention, like reference characters designate like elements performing the like function respectively and the description thereof will be omitted.

Figure 2:
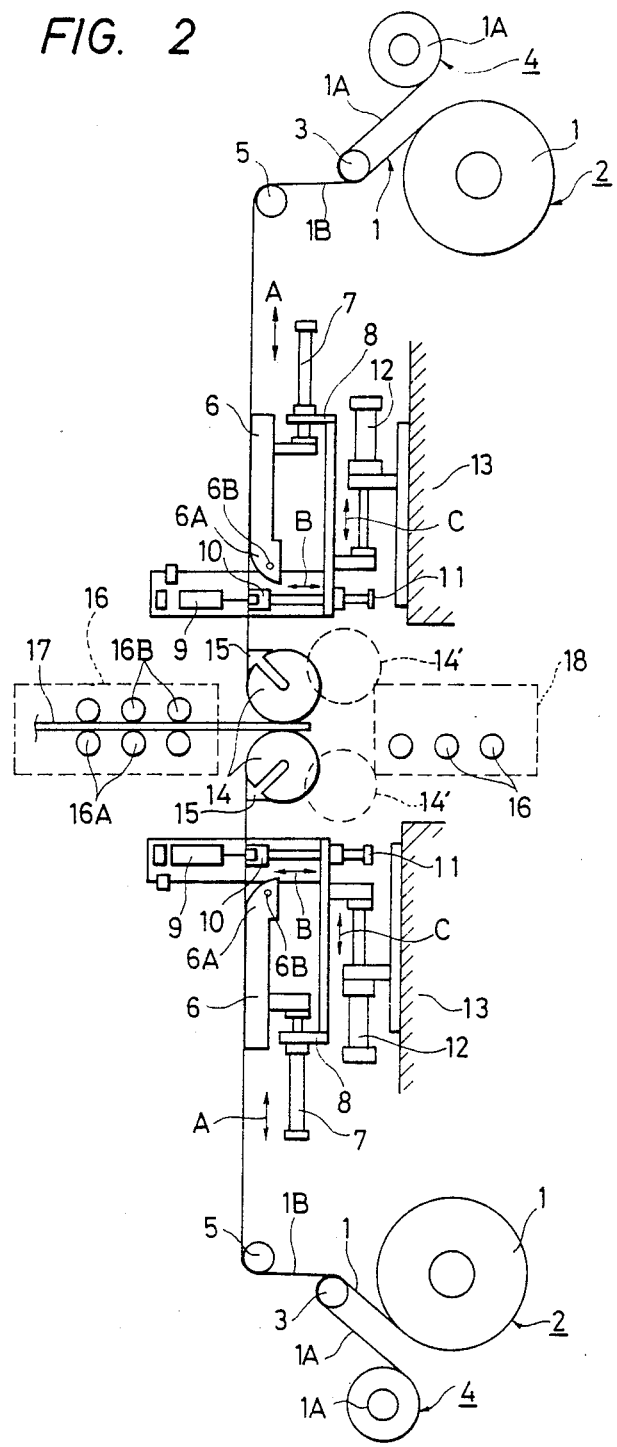
FIG. 2 is a copy structural view of a film laminator related to the apparatus for conveying a base according to the present invention.

FIG. 2 is a schematic structural view of a film laminator employing an apparatus for conveying a base embodying the present invention.

In a film laminator shown in FIG. 2, a three-layer laminate 1 consisting of a photosensitive resin layer and a translucent resin film is continuously wound on each supply roller 2. The laminate 1 wound on the supply roller 2 is separated by a peeling roller 3 into a translucent resin film (protective film) 1A and a laminate 1B composed of the photosensitive resin layer with one side exposed (adhesive surface) and the translucent resin film. The translucent resin film 1A thus separated is so arranged as to be rolled around a take-up roller 4.

The front end of the laminate 1B in the supply direction is absorbed by a main vacuum plate 6 through a tension roller 5 providing proper tension. The main vacuum plate 6 is supported by a frame 8 through an air cylinder 7 whose position is variable in the direction of an arrow A. The main vacuum plate 6, together with the tension roller 5, is used to supply the laminate 1B to a base 17 without causing wrinkles thereto.

An arcuate portion 6A at the front end of the main vacuum plate 6 constitutes a part of means for clamping the base under pressure and contains a heater 6B and bonds the front end of the laminate 1B onto the conductive layer of the base 17 through thermocompression bonding.

A rotary cutter 9 installed close to the arcuate portion 6A is used to cut the continuous laminate 1B into a piece corresponding in dimensions to the base 17.

A subvacuum plate 10 for having the front end of the laminate 1B thus cut off absorbed by the arcuate portion 6A is positioned opposite to the rotary cutter 9. The subvacuum plate 10 is supported by the frame 8 through an air cylinder 11 whose position is variable in the direction of an arrow B.

The frame 8 for supporting the main vacuum plate 6 and the subvacuum plate 10 is supported by a frame of the apparatus proper through an air cylinder 12 whose position is variable in the direction of an arrow C.

The laminate 1B whose front end is bonded by the arcuate portion 6A onto the conductive layer of the base 17 through thermocompression bonding is thoroughly bonded by a thermocompression roller 14 which constitutes a part of the means for clamping the base under pressure. The thermocompression roller 14 tentatively bonds the front end of the laminate 1B onto the arcuate portion 6A through thermocompression bonding and then moves from a position shown by a dotted line marked with numeral 14' of FIG. 2 to what is shown by a solid line.

The rear end of the laminate 1B out to size by the rotary cutter 9 is guided by a triangular rotary vacuum plate 15 in such a manner as to prevent it from wrinkling and being bonded by the thermocompression roller 14 through thermocompression bonding.

The film laminator thus constructed works to bond the laminate 1B on the base 17 supplied with the conductive layer on both sides (or one side) of the insulating base conveyed by the apparatus 16 for conveying a base comprising the conveyer rollers 16A and the presser rollers 16B. The laminate 1B is bonded onto the base 17 through thermocompression bonding so that the adhesive surface of the photosensitive resin layer whose translucent resin film 1A has been peeled off may stick to the surface of the conductive layer. The base 17 with the laminate 1B bonded thereto through thermocompression bonding is carried out of the apparatus 18 by a base discharging device.

FIG. 1 is a schematic structural view of the above apparatus 16 for conveying a base.

As shown in FIG. 1, the apparatus for conveying a base is coupled to the film laminator 1. Each conveyor roller 16A is formed with a (solid or hollow: preferably hollow) fiber-reinforced plastic columnar member and a plurality of conveyor rollers 16A are rotatably fitted to the frame 20 of the apparatus 16 proper. The plurality of conveyor rollers 16A are arranged a predetermined space apart to prevent the thin base 17 from drooping. Moreover, only every other one out of those conveyor rollers 16A is coupled to a driving source (not shown). Every two of the conveyor rollers 16A or all of them may be coupled to the driving source as occasion demands.

The base 17 is mounted on the conveyor rollers 16A and conveyed while held by the presser rollers 16B. When a thin base is conveyed, warping and waving are remedied. Like the conveyor roller 16A, each presser roller 16B, which is rotatably fitted to a frame 20, is also formed with a columnar member to keep the end of the base 17 from being caught by the rotary means built of a discoidal member and stopped when the base 17 is thin enough to readily warp and wave. Although the presser rollers 16B are not coupled to the driving source, they may also be coupled thereto. When a base 17 which is not thin and tends to less warp and wave is used, the presser rollers 16B may be rotary means prepared by splitting a plurality of discoidal members.

Figure 3:
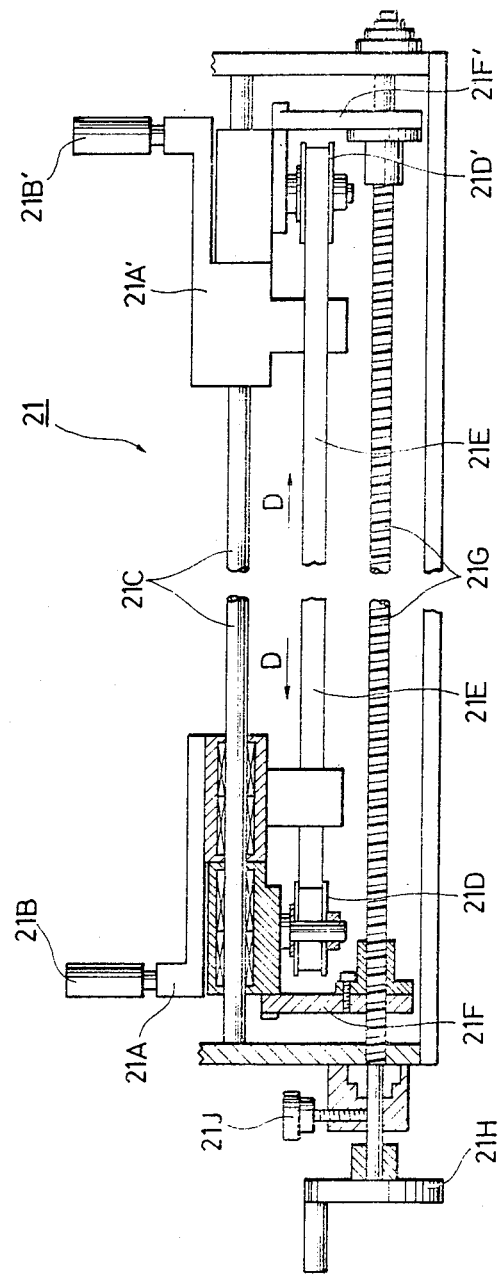
FIG. 3 is a sectional view taken on line Y—Y of FIG. 1.
Figure 4:
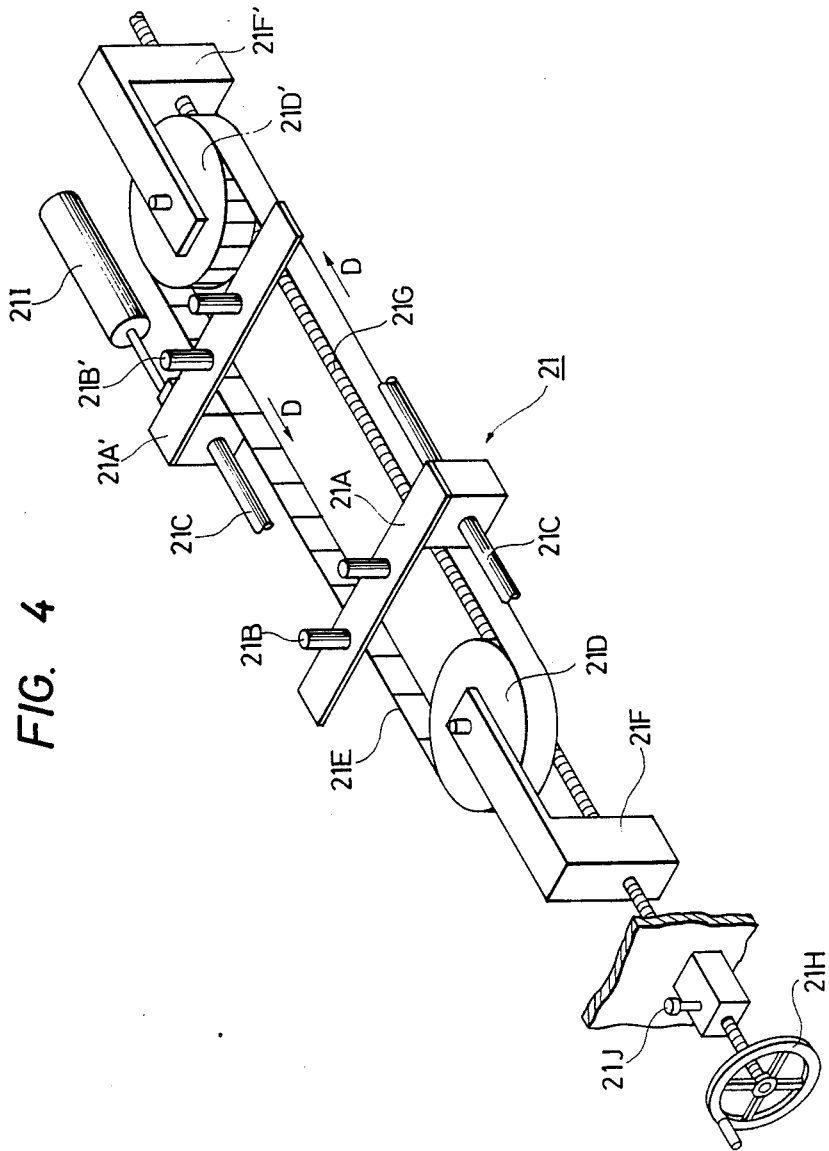
FIG. 4 is a perspective structural view of the crosswise base guide of FIG. 3.

A crosswise base guide 21 is intended to align the centerline of the laminate 1B in the conveyance direction and the centerline in the conveyance direction of the base 17. As shown in FIG. 3 (sectional view taken on line Y—Y) and FIG. 4 (perspective view), the crosswise base guide 21 is formed of crosswise base guide members 21B, 21B' supported by support members 21A, 21A'. The support members 21A, 21A' are slidably fitted to a support rod 21C. The support members 21A, 21A' are also fitted to an endless belt 21E wound on pulleys 21D, 21D' in such a manner that they are moved close to each other when the endless belt 21E moves in the direction of an arrow D. The support members 21A, 21A' are caused to slide by an air cylinder 21I installed on the support member 21A'. The pulleys 21D, 21D' are supported by inverted L-shaped support members 21F, 21F', respectively. The inverted L-shaped support members 21F, 21F' mate with a threaded rod 21G, which is equipped with a handle 21H and, by turning the handle 21H, the inverted L-shaped support members 21F, 21F' are transversely moved while a fixed distance is held by them therebetween. The moving mechanism (fine adjustment mechansim) is intended to adjust the position of the crosswise base guide 21 to make the centerline in the conveyance direction of the base 17 coincide with the centerline in the conveyance direction of the laminate 1B for thermocompression bonding, i.e., the centerline of the apparatus 16 for conveying a base in case the former shifts from the latter. The position of the crosswise base guide 21 is fixed with a screw 21J for fixing the rotation of the threaded rod 21G.

A base position detecting sensor 22 for detecting the front (or rear) end of the base 17 produces a signal for starting driving the crosswise base guide members 21B, 21B' of the crosswise base guide 21. The base position detecting sensor 22 is fitted to the frame 20 through a support frame 22A. A reflective optical sensor is, for instance, employed as the base position detecting sensor 22.

Base breadth detecting sensors 23A, 23B for respectively detecting both ends of the base 17 produce signals for stopping driving the crosswise base guide members 21B, 21B' of the crosswise base guide 21. The base breadth detecting sensors 23A, 23B are installed on the inner sides of the crosswise base guide members 21B, 21B' close to the front end of the conveyance direction of the support members 21A, 21A'. In other words, the base breadth detecting sensors 23A, 23B are installed in such a position as to stop the crosswise base guide members 21B, 21B' when the centerline of the base coincides with the centerline of the apparatus for conveying a base. The control of the crosswise base guide 21 can simply be materialized by causing the signal for stopping driving the crosswise base guide members 21B, 21B' to be produced slightly later than the time both ends of the base 17 are detected by the base breadth detecting sensors 23A, 23B using a delay circuit. As the base breadth detecting sensors 23A, 23B, translucent type optical sensors are used.

The base 17 can thus be conveyed to the starting position of thermocompression bonding readily and accurately in such a state that the centerline in the conveyance direction of the base 17 is made to coincide with the centerline in the conveyance direction of the apparatus for conveying a base without allowing the base 17 to bend by installing the crosswise base guide 21 for making the centerline in the conveyance direction of the base 17 coincide with the centerline in the conveyance direction of the apparatus for conveying a base, the base position detecting sensor 22 for starting the operation of the crosswise base guide 21 and the base breadth detecting sensors 23A, 23B for stopping the operation of the crosswise base guide 21.

Figure 5:
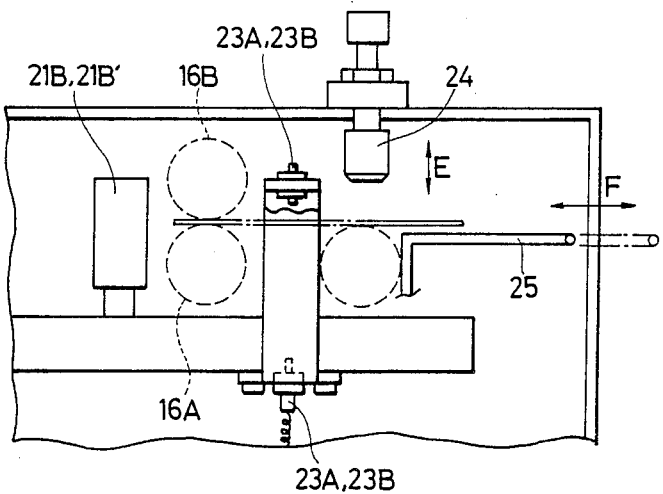
FIG. 5 is a side view showing the construction of the base breadth detecting sensors, the holding member and the base support member shown in FIG. 1.
Figure 6:
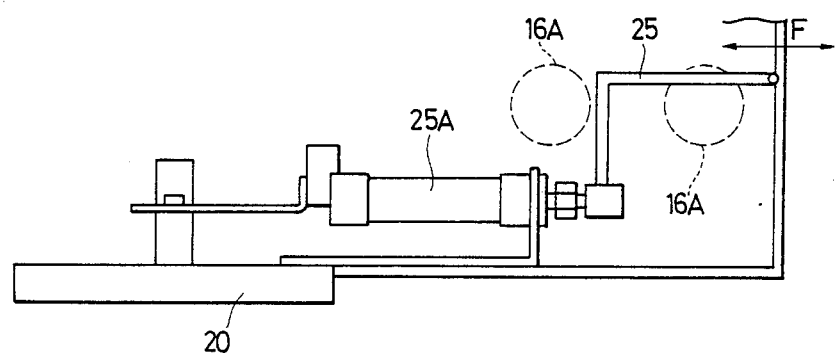
FIG. 6 is a side view showing the construction of the base support member of FIG. 1.

A base holding member 24 shown in FIG. 1 fixes and holds the base 17 so that it may not drop when the base 17 reaches the starting position of the thermocompression bonding. As shown in FIG. 5 (side view), the base holding member 24 is fitted to the frame 20 and moved by an air cylinder and a spring (not shown) in the direction of an arrow E. Moreover, a base support member 25 projects in the direction of an arrow F interlockingly or not interlockingly with the operation of driving the base holding member 24. The control of the base support member 25 in the direction of the arrow E is conducted by an air cylinder 25A fitted to the frame 20. The operation of the base holding member 24 or base support member 25 is controlled by the signal (not shown) for starting or stopping driving the base position detecting sensor.

The base holding member 24 and the base support member 25 thus installed support the base 17 to prevent the base 17 from dropping when it reaches the starting position of the thermocompression bonding and are capable of holding it in position until the thermocompression rollers vertically sandwich it therebetween, so that the laminate 1B is accurately bonded onto the base 17 through thermocompression bonding.

The operation of the apparatus for conveying a base according to the present invention will briefly be described.

In FIG. 1, the base 17 is conveyed toward the thermocompression rollers 14 by driving the given number of conveyor rollers 16A among the plurality of them. When the front end of the base 17 thus conveyed is detected by the base position detecting sensor 22, the crosswise base guide 21 starts operating according to the drive-starting signal. The crosswise base guide 21 operates so as to make the centerline of the base 17 coincide with the centerline of the apparatus 16 for conveying a base using the crosswise base guide members 21B, 21B'. When both ends of the base 17 are then detected by the base breadth detecting sensors 23A, 23B, the operation of the crosswise base guide 21 is stopped by the drive-stopping signal. The base 17 is consequently conveyed to the position of thermocompression bonding in such a state that the centerline in the conveyance direction of the base 17 coincides with the centerline in the conveyance direction of the apparatus for conveying a base. At this time, the conveyor rollers 16A are stopped by the base position detecting sensor (not shown) and the holding member 24 moves down and makes the base immovable. The base support member 25 simultaneously projects to support and prevent the base 17 from dropping. Then as shown in FIG. 2, the thermocompression rollers 14 move to the base 17 on the left and sandwich the base 17 through the laminate 1B thermocompression bonded. The thermocompression rollers 14 and the conveyor rollers 16A are driven so that the laminate 1B is bonded onto the laminate 1B through thermocompression bonding.

Although the present invention has been described in its preferred form with a certain degree of particularity, it is needless to say understood that the invention is not limited to the specific embodiments thereof and modification of the invention is possible within its spirit and scope as set out in the accompanying claims.

For example, according to the present invention, the base holding member is provided so that the base is prevented from being undesirably moved when the base is fed to the base tentative thermocompression bonding start position and the arcuate members 6A press the base vertically. The thin film to be laminated thereon may be laminated exactly on the base. The thermocompression bonding start position is set at the same position as the thermocompression start position of the thermocompression rollers, and the base holding member is operated also upon the thermocompression start. Therefore, it is possible to exactly thermally laminate the thin films on the base.

We claim:

1. An apparatus for conveying and holding a base, comprising:
    conveying means for transporting said base to a predetermined fixed position;
    means for aligning a centerline of said base with a centerline of said apparatus while said base is being conveyed by said conveying means;
    a base holding member disposed above said base at said fixed position and movable in a direction perpendicular to a substantially horizontal plane defined by said base for holding said base at said fixed position;
    a base support member movable in a direction parallel to said horizontal plane for supporting said base from below at said fixed position; and
    means for clamping a sheet to be arranged on said base and pressing said sheet onto said base after said base has been held in said fixed position by said base holding member and said base support member.

2. The conveying and holding apparatus of claim 1, wherein said conveying means comprises a plurality of pairs of conveying and pressing rollers.

3. The conveying and holding apparatus of claim 1, wherein said clamping and pressing means comprises a pair of main vacuum plates and a pair of thermocompression rollers.

4. An apparatus for conveying and holding a base, comprising:

conveying means for transporting said base to a predetermined fixed position;

means for aligning a centerline of said base with a centerline of said apparatus while said base is being conveyed by said conveying means;

a base holding member disposed above said base at said fixed position and movable in a direction perpendicular to a plane of said base for holding said base at said fixed position;

a base support member movable in a direction parallel to a plane of said base for supporting said base from below at said fixed position; and means for clamping a sheet to be arranged on said base and pressing said sheet onto said base after said base has been held in said fixed position by said base holding member and said base support member;

wherein said base holding member is retracted prior to operation of said clamping and pressing means.

* * * * *